(12) United States Patent
Lam (10) Patent No.: US 10,217,718 B1
(45) Date of Patent: Feb. 26, 2019

(54) METHOD FOR WAFER-LEVEL SEMICONDUCTOR DIE ATTACHMENT

(71) Applicant: Denselight Semiconductors Pte. Ltd., Singapore (SG)

(72) Inventor: Yee Loy Lam, Singapore (SG)

(73) Assignee: DenseLight Semiconductors Pte. Ltd., Singapore (SG)

( * ) Notice: Subject to any disclaimer, the term of this patent is extended or adjusted under 35 U.S.C. 154(b) by 0 days.

(21) Appl. No.: 15/783,455

(22) Filed: Oct. 13, 2017

(51) Int. Cl.
*H01L 23/00* (2006.01)
*H01L 21/78* (2006.01)
*H01L 23/498* (2006.01)
*H01L 23/544* (2006.01)

(52) U.S. Cl.
CPC .............. *H01L 24/97* (2013.01); *H01L 21/78* (2013.01); *H01L 23/49811* (2013.01); *H01L 23/544* (2013.01); *H01L 24/89* (2013.01); *H01L 24/08* (2013.01); *H01L 2223/54426* (2013.01); *H01L 2224/08225* (2013.01); *H01L 2224/08502* (2013.01); *H01L 2224/8013* (2013.01); *H01L 2224/80132* (2013.01); *H01L 2224/80141* (2013.01); *H01L 2224/80143* (2013.01); *H01L 2224/80815* (2013.01); *H01L 2924/20107* (2013.01)

(58) Field of Classification Search
CPC . H01L 2224/11015; H01L 2224/13027; H01L 2224/16105; H01L 2224/10135; H01L 2224/10165; H01L 2224/0224; H01L 2224/03015; H01L 2224/81143; H01L 2224/81141
See application file for complete search history.

(56) References Cited

U.S. PATENT DOCUMENTS

| 6,517,656 | B1 | 2/2003 | DiCaprio |
| 6,593,168 | B1 | 7/2003 | Ehrichs et al. |
| 6,657,124 | B2 * | 12/2003 | Ho ............... H01L 23/49816 174/521 |
| 7,811,932 | B2 * | 10/2010 | Pozder ............... H01L 24/11 257/737 |
| 8,241,995 | B2 | 8/2012 | Chen et al. |

(Continued)

FOREIGN PATENT DOCUMENTS

JP 0616521 B2 3/1994

*Primary Examiner* — Daniel Luke
(74) *Attorney, Agent, or Firm* — Goldberg Segalla LLP (57) ABSTRACT

A wafer-level semiconductor die attachment method includes placing a semiconductor die of a plurality of semiconductor dies at an initial placement position to overlap a sub-mount pad on a sub-mount of a pre-singulated wafer. A die pad of the semiconductor die comes in contact with a solder layer deposited over the sub-mount pad. The semiconductor die and the sub-mount include a plurality of die and sub-mount mating features, respectively. The solder layer is heated locally to temporarily hold the semiconductor die at the initial placement position. The pre-singulated wafer is reflowed, when each semiconductor die is temporarily held at the corresponding initial placement position. During reflow, each semiconductor die slides from the initial placement position and a contact is established between the corresponding plurality of die and sub-mount mating features. Thereby, each semiconductor die is permanently attached to the corresponding sub-mount.

20 Claims, 9 Drawing Sheets

(56) References Cited

U.S. PATENT DOCUMENTS

| | | |
|---|---|---|
| 8,476,772 B2 | 7/2013 | Do et al. |
| 8,487,428 B2 * | 7/2013 | Lee .................. H01L 23/10 |
| | | 174/545 |
| 9,462,693 B2 * | 10/2016 | Okamoto .......... H01L 23/49816 |
| 9,548,290 B2 * | 1/2017 | Wakiyama ............ H01L 23/544 |
| 2014/0090234 A1 | 4/2014 | Kazmer |
| 2016/0013076 A1 | 1/2016 | Vincent |
| 2016/0293811 A1 | 10/2016 | Hussell |

* cited by examiner

METHOD FOR WAFER-LEVEL SEMICONDUCTOR DIE ATTACHMENT

FIELD OF THE INVENTION

The present invention relates to a method of semiconductor die attachment, and more particularly to a method for attaching multiple semiconductor dies to a pre-singulated wafer.

BACKGROUND

Optoelectronic packages generally include one or more semiconductor dies, such as waveguide-based diode lasers, photo-detectors, and planar lightwave circuits (PLCs), permanently attached to a sub-mount. For optical alignment requirements, high precision is required during initial placement of a semiconductor die on a sub-mount. Generally, such high precision is achieved by aligning various alignment features, such as fiducial marks, on both the semiconductor die and the sub-mount by use of optical microscopy alignment method. Placement accuracy of instruments, such as optical microscopes, used in optical microscopy alignment methods depends on magnification level of the instruments. Higher magnification level of the instruments, such as optical microscope, leads to higher placement accuracy. This in turn increases the die placement time, thereby resulting in reduced process throughput, which is undesirable.

After placement, the semiconductor die is permanently attached to the sub-mount by way of soldering. Typically, the semiconductor dies used in optoelectronic packages have exposed optical facets. Therefore, for avoiding contamination of the optical facets by flux residue formed during soldering, fluxless soldering, such as eutectic soldering, is performed to attach the semiconductor die to the sub-mount. Solder materials with eutectic composition, such as gold-tin alloy, form hard solder joints with excellent creep resistance, thus optical alignment remains intact over time. However, solder materials having such eutectic composition cannot undergo subsequent reflow at eutectic temperature. Hence, semiconductor die attachment method using eutectic soldering is conventionally performed on singulated sub-mounts as shown in FIG. 1.

Figure 1:
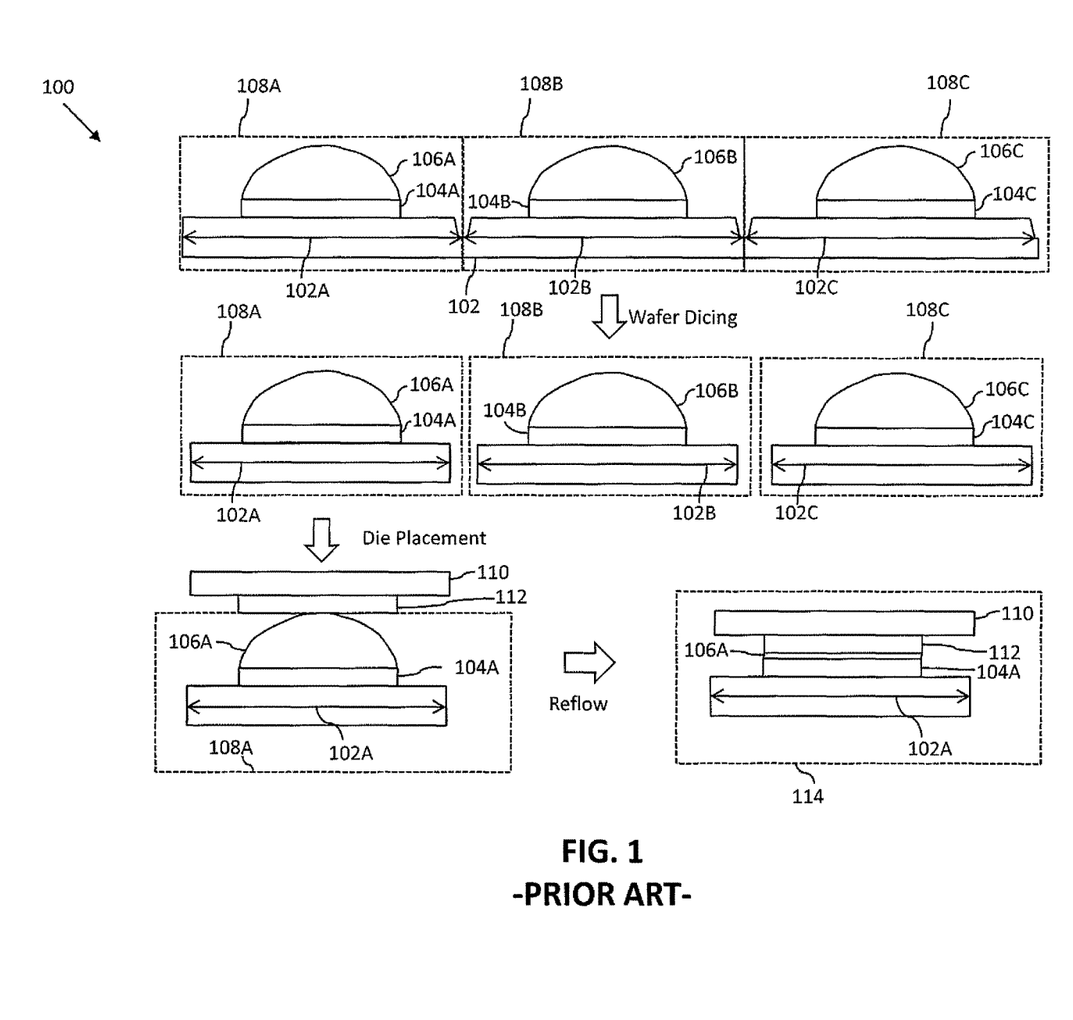
FIG. 1 is a cross-sectional view that illustrates steps of a conventional method for semiconductor die attachment.

FIG. 1 is a cross-sectional view 100 that illustrates steps of a conventional method for semiconductor die attachment. A pre-singulated wafer 102 having a plurality of sub-mount pads 104 (hereinafter referred to as "sub-mount pads 104") is loaded on a placement bench (not shown) of a dicing tool (not shown). The sub-mount pads 104 include first through third sub-mount pads 104A-104C. The pre-singulated wafer 102 including the first through third sub-mount pads 104A-104C may be formed by wafer processing, such as deposition, lithography, and etching, of an SiOB wafer (not shown). The first through third sub-mount pads 104A-104C are deposited with first through third solder layers 106A-106C having eutectic composition, such as gold-tin alloy. The first portion 102A along with the first sub-mount pad 104A and the first solder layer 106A constitutes a first sub-mount 108A of the pre-singulated wafer 102. Similarly, the second portion 102B along with the second sub-mount pad 104B and the second solder layer 106B constitutes a second sub-mount 108B, and the third portion 102C along with the third sub-mount pad 104C and the third solder layer 106C constitutes a third sub-mount 108C. The first through third sub-mounts 108A-108C are the first through third semiconductor die mounting sites of the pre-singulated wafer 102. The dicing tool dices the pre-singulated wafer 102 to singulate the first through third sub-mounts 108A-108C.

The diced first sub-mount 108A is then picked and loaded on a placement bench (not shown) of a die placement tool (not shown). The die placement tool uses optical microscopy alignment method for placing a semiconductor die 110 over the first sub-mount 108A. The semiconductor die 110 has a die pad 112 formed thereon. The die placement tool places the semiconductor die 110 over the first sub-mount 108A such that the die pad 112 comes in contact with the first solder layer 106A. For placing the semiconductor die 110 accurately, the die placement tool aligns a die alignment feature (not shown) of the semiconductor die 110 with a sub-mount alignment feature (not shown) of the first sub-mount 108A by using the optical microscopy alignment method. The die alignment feature and the sub-mount alignment feature are fiducial marks that are formed on the semiconductor die 110 and the first sub-mount 108A, respectively. The first sub-mount 108A is then reflowed at eutectic temperature, for example at 278° C., for permanently attaching the semiconductor die 110 to the first sub-mount 108A. The first solder layer 106A melts during the reflow process and solidifies when the reflow process ends, thereby permanently attaching the semiconductor die 110 to the first sub-mount 108A. The first sub-mount 108A having the semiconductor die 110 attached to it is a first die attached sub-mount package 114.

The entire process of die placement and reflow is then repeated for the remaining sub-mounts, such as the second and third sub-mounts 108B and 108C, to obtain second and third die attached sub-mount packages (not shown).

In the conventional method for semiconductor die attachment, the semiconductor die placement and reflow steps are performed for a single semiconductor die, such as the semiconductor die 110, at a time until each of the sub-mounts 108 has the semiconductor die 110 permanently attached to it. The time required for obtaining the first die attached sub-mount package 114 is a sum of wafer dicing time, die placement time, and reflow time. In one example, the wafer dicing time for obtaining one singulated sub-mount is 1 second, the die placement time is 3 seconds, and the reflow time is 25 seconds. Therefore, the time required for obtaining the first die attached sub-mount package 114 is 29 seconds. In a scenario, when the pre-singulated wafer 102 includes 1,000 sub-mounts similar to the first sub-mount 108A, the time required for obtaining 1,000 die attached sub-mount packages amounts to 29,000 seconds, i.e., 8.05 hours, which is very high and leads to reduced process throughput and low process efficiency.

Since cost of optoelectronic packaging depends, at least in part, on the process efficiency and process throughput of the semiconductor die attachment method, improvements in process efficiency and process throughput are highly desirable. In light of the foregoing, there exists a need for a semiconductor die attachment method that entails less placement time with high precision alignment accuracy, and has high process throughput with increased process efficiency in comparison to prior art solutions.

SUMMARY

In an embodiment of the present invention, a wafer-level semiconductor die attachment method is provided. The wafer-level semiconductor die attachment method includes placing a first semiconductor die of a plurality of semiconductor dies at an initial placement position to overlap a first portion of a sub-mount pad on a first sub-mount of a plurality of sub-mounts of a pre-singulated wafer. A die pad of the first semiconductor die is in contact with a first portion of a solder layer deposited over the sub-mount pad. The first semiconductor die includes a first plurality of die mating features and the first sub-mount includes a first plurality of sub-mount mating features. The first portion of the solder layer that is in contact with the die pad of the first semiconductor die is heated to temporarily hold the first semiconductor die at the initial placement position. The pre-singulated wafer is reflowed. Due to reflowing of the pre-singulated wafer, the first semiconductor die slides from the initial placement position to a final placement position and a contact is established between the first plurality of die mating features and the corresponding first plurality of sub-mount mating features. Thus, the first semiconductor die is permanently attached to the first sub-mount at the final placement position.

In another embodiment of the present invention, a wafer-level semiconductor die attachment method is provided. The wafer-level semiconductor die attachment method includes placing a first semiconductor die of the plurality of semiconductor dies at an initial placement position to overlap a first portion of a sub-mount pad on a first sub-mount of the plurality of sub-mounts of a pre-singulated wafer. A die pad of the first semiconductor die is in contact with a first portion of a solder layer deposited over the sub-mount pad. The first semiconductor die includes a first plurality of die mating features and the first sub-mount includes a first plurality of sub-mount mating features. The first portion of the solder layer that is in contact with the die pad of the first semiconductor die is heated to temporarily hold the first semiconductor die at the initial placement position. Further, the pre-singulated wafer is reflowed, when each semiconductor die of the plurality of semiconductor dies is temporarily held at the corresponding initial placement position. Due to reflowing of the pre-singulated wafer, the first semiconductor die slides from the initial placement position to a final placement position and a contact is established between the first plurality of die mating features and the corresponding first plurality of sub-mount mating features. Thus, the first semiconductor die is permanently attached to the first sub-mount at the final placement position. When each semiconductor die of the plurality of semiconductor dies is permanently attached to the corresponding sub-mount of the plurality of sub-mounts, the pre-singulated wafer is diced to obtain a plurality of die attached sub-mount packages.

In yet another embodiment of the present invention, a die attached sub-mount package prepared by the wafer-level semiconductor die attachment methods described in the foregoing is provided.

In the wafer-level semiconductor die attachment method, in accordance with an embodiment of the present invention, the precision in alignment accuracy of the first semiconductor die is achieved by way of the of die mating features and the sub-mount mating features. The position of formation of each die mating feature and sub-mount mating feature is based on optical alignment requirement of the first semiconductor die with the first sub-mount. Hence, the contact between the die mating features and the corresponding sub-mount mating features results in high alignment accuracy. Therefore, the wafer-level semiconductor die attachment method attains high alignment accuracy without the requirement of high initial placement accuracy, thereby requiring less time for placing the first semiconductor die over the first sub-mount, in comparison to conventional die attachment processes that solely rely on die and sub-mount alignment features for achieving alignment accuracy. Further, in the wafer-level semiconductor die attachment method, the steps of placing a semiconductor die over a sub-mount and heating the first portion of the solder layer that is in contact with the die pad of the semiconductor die are performed for a single semiconductor die at a time until each sub-mount has one or more semiconductor dies temporarily held thereon. However, the reflow process for attaching the semiconductor dies to the corresponding sub-mount is performed at wafer-level in contrast to the conventional die attachment processes, where each sub-mount is reflowed separately, thereby reducing the cost of optoelectronic packaging and improving the process efficiency and the process throughput.

BRIEF DESCRIPTION OF THE DRAWINGS

The accompanying drawings illustrate various embodiments of systems, methods, and other aspects of the invention. It will be apparent to a person skilled in the art that the illustrated element boundaries (e.g., boxes, groups of boxes, or other shapes) in the figures represent one example of the boundaries. In some examples, one element may be designed as multiple elements, or multiple elements may be designed as one element. In some examples, an element shown as an internal component of one element may be implemented as an external component in another, and vice versa.

Various embodiments of the present invention are illustrated by way of example, and not limited by the appended figures, in which like references indicate similar elements, and in which.

Further areas of applicability of the present invention will become apparent from the detailed description provided hereinafter. It should be understood that the detailed description of exemplary embodiments is intended for illustration purposes only and is, therefore, not intended to necessarily limit the scope of the present invention.

DETAILED DESCRIPTION

The present invention is best understood with reference to the detailed figures and description set forth herein. Various embodiments are discussed below with reference to the figures. However, those skilled in the art will readily appreciate that the detailed descriptions given herein with respect to the figures are simply for explanatory purposes as the methods and systems may extend beyond the described embodiments. In one example, the teachings presented and the needs of a particular application may yield multiple alternate and suitable approaches to implement the functionality of any detail described herein. Therefore, any approach may extend beyond the particular implementation choices in the following embodiments that are described and shown.

References to "an embodiment", "another embodiment", "yet another embodiment", "one example", "another example", "yet another example", "for example" and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

Figure 2A:
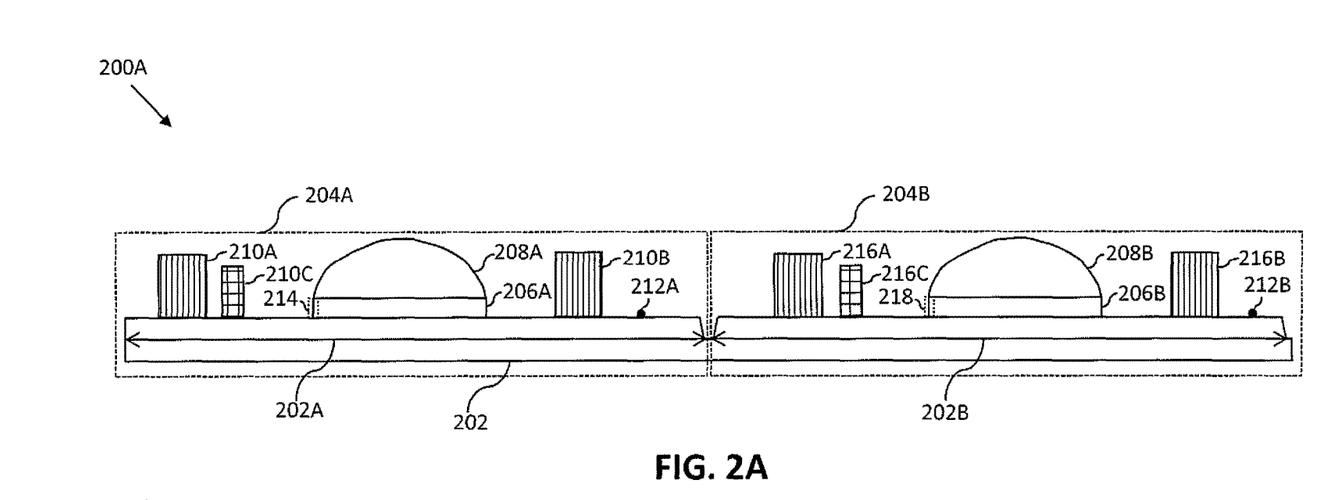
FIGS. 2A-2F are cross-sectional views that illustrate steps of a wafer-level semiconductor die attachment method, in accordance with an embodiment of the present invention.

Referring now to FIGS. 2A-2F, cross-sectional views 200A-200F that illustrate steps of a wafer-level semiconductor die attachment method in accordance with an embodiment of the present invention are shown. With reference to FIG. 2A, the cross-sectional view 200A illustrates a pre-singulated wafer 202 that is loaded on a placement bench (not shown) of a die placement tool (not shown).

The pre-singulated wafer 202 has various die mounting sites, such as first and second sub-mounts 204A and 204B. The pre-singulated wafer 202 may be fabricated from various materials. Examples of such materials include semiconductor materials, such as silicon, ceramic materials, such as Aluminum Nitrate, and amorphous materials, such as glass, quartz, and the like. For the sake of simplicity, the pre-singulated wafer 202 is shown to have two sub-mounts 204A and 204B. However, it will be apparent to a person having ordinary skill in the art that the pre-singulated wafer 202 may include any number of sub-mounts without departing from the scope and spirit of the present invention.

The first sub-mount 204A constitutes a first portion 202A of the pre-singulated wafer 202 and the second sub-mount 204B constitutes a second portion 202B of the pre-singulated wafer 202. The first sub-mount 204A includes a first sub-mount pad 206A onto which a first solder layer 208A is deposited. The first sub-mount pad 206A is a solder pad. In one embodiment, the first sub-mount 204A includes a single sub-mount pad, such as the first sub-mount pad 206A as shown in FIG. 2A. In another embodiment, the first sub-mount 204A may include an array of sub-mount pads (not shown). In an embodiment, the first sub-mount 204A may further include an optical waveguide conduit (not shown). The first sub-mount pad 206A is formed on the first portion 202A of the pre-singulated wafer 202. The first sub-mount 204A further includes first through third sub-mount mating features 210A-210C. Hereinafter, the first through third sub-mount mating features 210A-210C are collectively referred to as "sub-mount mating features 210". The first sub-mount 204A further includes one or more sub-mount alignment features, such as a first sub-mount alignment feature 212A. In one example, the first sub-mount alignment feature 212A is a fiducial mark, such as a cross, formed upon the first portion 202A of the pre-singulated wafer 202. In another example, a first edge 214 of the first sub-mount pad 206A may serve as the first sub-mount alignment feature 212A.

The second sub-mount 204B includes a second sub-mount pad 206B onto which a second solder layer 208B is deposited. The second sub-mount pad 206B is formed on the second portion 202B of the pre-singulated wafer 202 in a manner similar to formation of the first sub-mount pad 206A. The second sub-mount 204B further includes fourth through sixth sub-mount mating features 216A-216C. Hereinafter, the fourth through sixth sub-mount mating features 216A-216C are collectively referred to as "sub-mount mating features 216". The second sub-mount 204B further includes one or more sub-mount alignment features, such as a second sub-mount alignment feature 212B. In one example, the second sub-mount alignment feature 212B is a fiducial mark, such as cross, formed upon the second portion 202B of the pre-singulated wafer 202. In another example, a first edge 218 of the second sub-mount pad 206B may serve as the second sub-mount alignment feature 212B.

The sub-mount mating features 210 and 216 are physical structures, such as stand-off structures and stop blocks, formed on the first and second portions 202A and 202B of the pre-singulated wafer 202, respectively. The first, second, fourth, and fifth sub-mount mating features 210A, 210B, 216A, and 216B are stand-off structures. The third and sixth sub-mount mating features 210C and 216C are stop blocks. In one example, the pre-singulated wafer 202 including the first and second sub-mount pads 206A and 206B, and the sub-mount mating features 210 and 216 may be formed by wafer processing (deposition, lithography, and etching) of an SiOB wafer (not shown). Further, the position of the formation of the sub-mount mating features 210 and 216 is based on predefined optical alignment requirements. Hence, a predefined mask is used for etching the SiOB wafer for the formation of the sub-mount mating features 210 and 216. In one example, the first and second solder layers 208A and 208B are conductive metal layers having eutectic composition, such as gold-tin alloy.

Figure 2B:
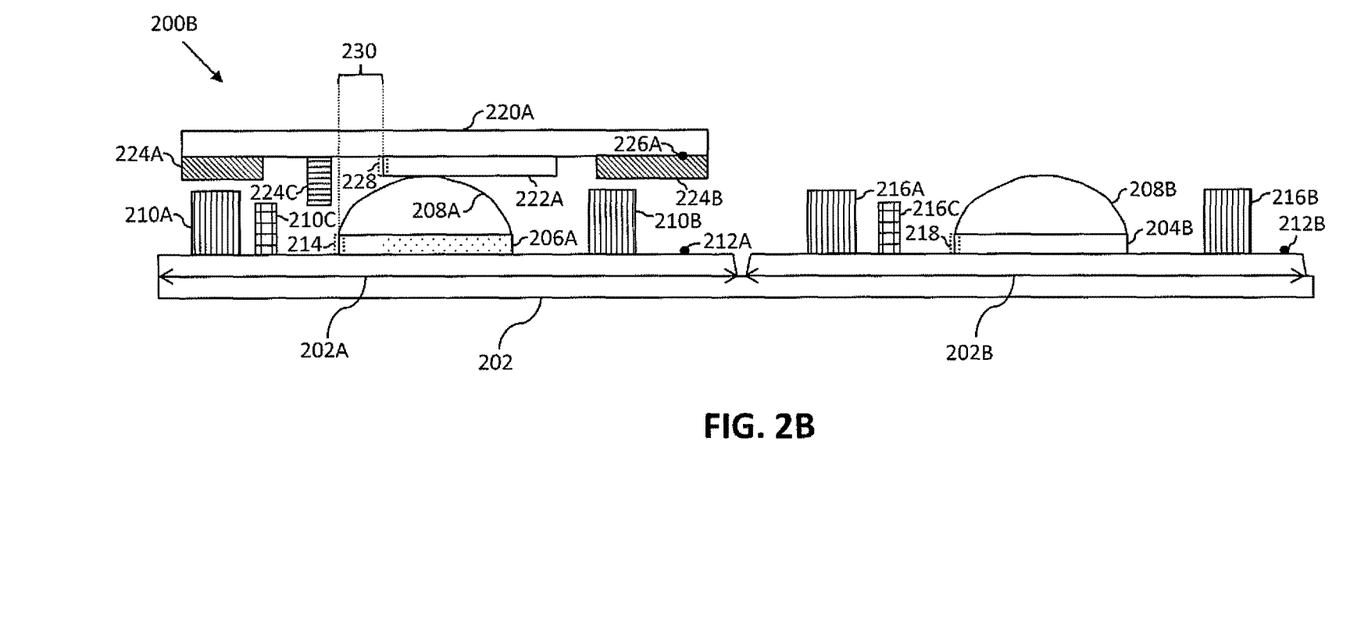

With reference to FIG. 2B, the cross-sectional view 200B illustrates a first semiconductor die 220A placed on the first sub-mount 204A. The first semiconductor die 220A includes a first die pad 222A. In one embodiment, the first semiconductor die 220A includes a single die pad, such as the first die pad 222A as shown in FIG. 2B. In another embodiment, the first semiconductor die 220A may include an array of die pads (not shown) at the position of the first die pad 222A. The first semiconductor die 220A further includes first through third die mating features 224A-224C. In one embodiment, the first die pad 222A and the first through third die mating features 224A-224C are formed by wafer processing, such as deposition, lithography, and etching, of the first semiconductor die 220A by using a predefined mask. Hereinafter, the first through third die mating features 224A-224C are collectively referred to as "die mating features 224". The die mating features 224 are physical structures formed on the first semiconductor die 220A. The first semiconductor die 220A further includes one or more die alignment features, such as a first die alignment feature 226A. In one example, the first die alignment feature 226A is a fiducial mark, such as a cross, formed on a side of the first semiconductor die 220A that faces the first sub-mount 204A. In another example, a first edge 228 of the first die pad 222A may serve as the first die alignment feature 226A.

The die placement tool picks up the first semiconductor die 220A to be placed at an initial placement position on the pre-singulated wafer 202. The first die pad 222A and the first through third die mating features 224A-224C of the first semiconductor die 220A face the first sub-mount 204A, when the die placement tool places the first semiconductor die 220A at the initial placement position. For placing the first semiconductor die 220A at the initial placement position, the die placement tool aligns the first die alignment feature 226A with the first sub-mount alignment feature 212A by using the optical microscopy alignment method. In one example, the die placement tool uses an optical microscope (not shown) to align the first die alignment feature 226A with the first sub-mount alignment feature 212A, such that the first die alignment feature 226A overlaps the first sub-mount alignment feature 212A.

When the first semiconductor die 220A is placed at the initial placement position, the first die pad 222A overlaps a first portion of the first sub-mount pad 206A. The first portion of the first sub-mount pad 206A that is overlapped by the first die pad 222A is represented by a dotted pattern. Further, the first edge 214 of the first sub-mount pad 206A and the first edge 228 of the first die pad 222A have a first predetermined offset 230 therebetween. The first die pad 222A comes in contact with a first portion of the first solder layer 208A. The first portion of the first solder layer 208A is locally heated by use of a laser beam (not shown) for temporarily holding the first semiconductor die 220A at the initial placement position. For example, the first semiconductor die 220A is temporarily held at the initial placement position by way of laser tacking. During laser tacking, the first portion of the first solder layer 208A is heated to a first temperature 'T1', which is lower than a eutectic temperature 'T2' of the first solder layer 208A. Hence, the first portion of the first solder layer 208A partially melts and solidifies, thereby tacking the first semiconductor die 220A to the first sub-mount 204A at the initial placement position. When the first semiconductor die 220A is temporarily held at the initial placement position, the die mating features 224 are not in contact with the corresponding sub-mount mating features 210.

Figure 2C:
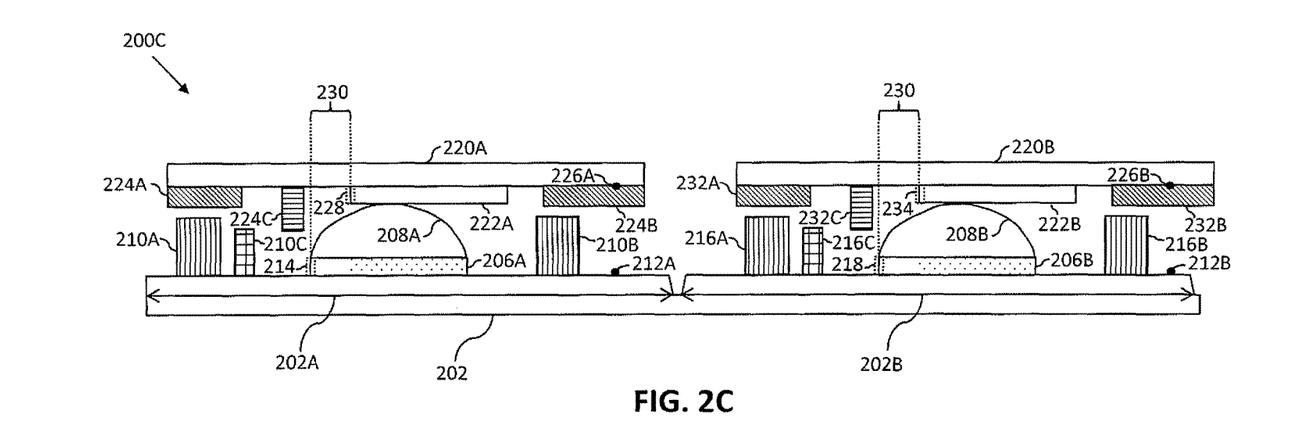

With reference to FIG. 2C, the cross-sectional view 200C illustrates a second semiconductor die 220B placed on the second sub-mount 204B. In one example, the second semiconductor die 220B is structurally and functionally similar to the first semiconductor die 220A. In another example, the second semiconductor die 220B may be structurally and functionally different from the first semiconductor die 220A. Examples of the first and second semiconductor dies 220A and 220B may include waveguide-based diode lasers, photodetectors, planar lightwave circuits (PLC), optoelectronic chips, and the like. Gallium arsenide, indium phosphide, gallium antimonide, and gallium nitride are examples of compound materials that may be used to form the first and second semiconductor dies 220A and 220B. It will be apparent to a person having ordinary skill in the art that the first and second semiconductor dies 220A and 220B may also be fabricated from materials other than semiconductor materials. Examples of such other materials include ceramics, such as Lithium Niobate, and amorphous materials, such as glass, quartz, and the like.

The second semiconductor die 220B includes a second die pad 222B and fourth through sixth die mating features 232A-232C. Hereinafter, the fourth through sixth die mating features 232A-232C are collectively referred to as "die mating features 232". The die mating features 232 are structurally and functionally similar to the die mating features 224. The second semiconductor die 220B further includes one or more die alignment features, such as a second die alignment feature 226B. In one example, the second die alignment feature 226B is structurally and functionally similar to the first die alignment feature 226A.

For placing the second semiconductor die 220E at the corresponding initial placement position, the die placement tool repeats the process similar to the process for the placement of the first semiconductor die 220A, as explained in the foregoing description. When the second semiconductor die 220B is placed at the corresponding initial placement position, the second die alignment feature 226B overlaps the second sub-mount alignment feature 212B, and the second die pad 222B overlaps a first portion of the second sub-mount pad 206B. The first portion of the second sub-mount pad 206B overlapped by the second die pad 222B is represented by a dotted pattern. Further, a first edge 218 of the second sub-mount pad 206B and a first edge 234 of the second die pad 222B have the first predetermined offset 230 therebetween, and the second die pad 222B is in contact with a first portion of the second solder layer 208B. The second semiconductor die 220B is temporarily held at the corresponding initial placement position by way of the laser tacking. Hereinafter, the first and second semiconductor dies 220A and 220B are collectively referred to as "semiconductor dies 220".

Figure 2D:
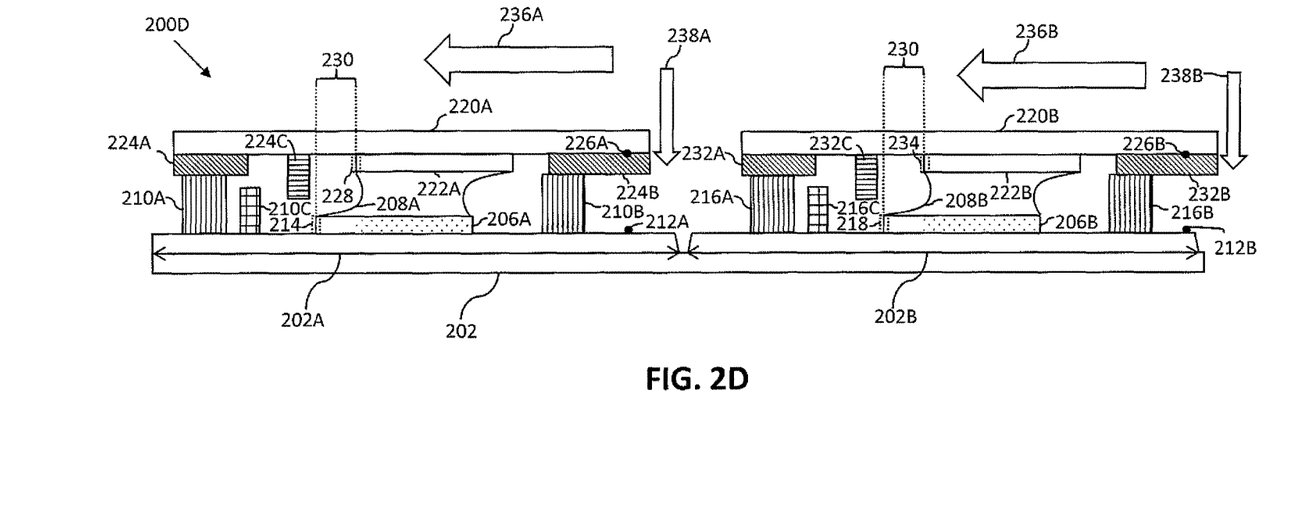

With reference to FIG. 2D, the cross-sectional view 200D illustrates a reflow process for the pre-singulated wafer 202, when each of the semiconductor dies 220 is temporarily held at the corresponding initial placement position on the pre-singulated wafer 202. For the sake of simplicity, the reflow process for the pre-singulated wafer 202 is explained with respect to the first semiconductor die 220A and the first sub-mount 204A. However, it will be apparent to a person skilled in the art that the second semiconductor die 220B and the second sub-mount 204B (and all other semiconductor dies and sub-mounts present) undergo the same reflow process as the first semiconductor die 220A and the first sub-mount 204A, simultaneously.

The pre-singulated wafer 202, having the semiconductor dies 220 held at the corresponding initial placement positions, is unloaded from the placement bench and loaded into a reflow station (not shown). In one example, the reflow station is a reflow oven that heats the pre-singulated wafer 202 in a controlled environment and at a controlled temperature during the reflow process. Before the reflowing process starts, the pre-singulated wafer 202 is at room temperature T0, such as at 25° C.

At the start of the reflow process, the reflow station heats the pre-singulated wafer 202 to attain the eutectic temperature 'T2', for example 278° C. When the eutectic temperature 'T2' is attained, the first solder layer 208A melts and comes in complete contact with the first die pad 222A. The first solder layer 208A in its melted form has high surface tension. The first solder layer 208A tends to minimize the high surface tension by reducing its surface area, and in doing so, the first solder layer 208A introduces a self-alignment restoring force.

The self-alignment restoring force has a lateral component of force, depicted by first and second arrows 236A and 236B, and a vertical component of force, depicted by third and fourth arrows 238A and 238B. The lateral component of force aligns the first solder layer 208A laterally, and the vertical component of force pulls the first solder layer 208A vertically-downwards to reduce the surface area of the first solder layer 208A. Since the first solder layer 208A is in contact with the first die pad 222A and has high adhesive property, the first semiconductor die 220A comes under the influence of the self-alignment restoring force. The first semiconductor die 220A slides in a lateral direction due to the lateral component of force, and in a vertically-downward direction due to the vertical component of force. Hence, the self-alignment restoring force displaces the first semiconductor die 220A from the initial placement position, both in lateral and vertically-downward directions.

When the first semiconductor die 220A is pulled down due to the vertical component of force, the first and second die mating features 224A and 224B of the first semiconductor die 220A come in contact with the first and second sub-mount mating features 210A and 210B of the first sub-mount 204A, respectively. Under the influence of the vertical component of force, the first and second die mating features 224A and 224B are pressed against the first and second sub-mount mating features 210A and 210B, respectively. The first and second sub-mount mating features 210A and 210B prevent the first semiconductor die 220A from sliding further in the vertically-downward direction. However, the first semiconductor die 220A continues to slide in the lateral direction due to the lateral component of force even after the first and second die mating features 224A and 224B are pressed against the first and second sub-mount mating features 210A and 210B, respectively. Hence, the first and second die mating features 224A and 224B slide over the first and second sub-mount mating features 210A and 210B, respectively, under the influence of the lateral component of force.

As the first semiconductor die 220A continues to slide laterally, the third die mating feature 224C comes in contact with the third sub-mount mating feature 210C. Under the influence of the lateral component of force, the third die mating feature 224C is pressed against the third sub-mount mating feature 210C, and the third sub-mount mating feature 210C prevents the first semiconductor die 220A from sliding further in the lateral direction. When the first through third die mating features 224A-224C are in contact with the first through third sub-mount mating features 210A-210C, respectively, the first semiconductor die 220A is in a final placement position. Thus, the self-alignment restoring force displaces the first semiconductor die 220A from the initial placement position to the final placement position. The reflow station maintains the eutectic temperature 'T2' for a predetermined time interval until the first semiconductor die 220A is at the final placement position. Thus, by way of the die mating features 224 and the sub-mount mating features 210, the first semiconductor die 220A is placed at the final placement position with 3-dimensional placement accuracy without the requirement of high accuracy during placement at the initial placement position. Further, when the first semiconductor die 220A is placed at the final placement position, accurate optical alignment of the first semiconductor die 220A with the optical waveguide conduit (not shown) of the first sub-mount 204A is achieved.

It will be apparent to a person having ordinary skill in the art that within a similar time duration due to process variances, the second semiconductor die 220B is also simultaneously displaced to the corresponding final placement position under the influence of the self-alignment restoring force.

Figure 2E:
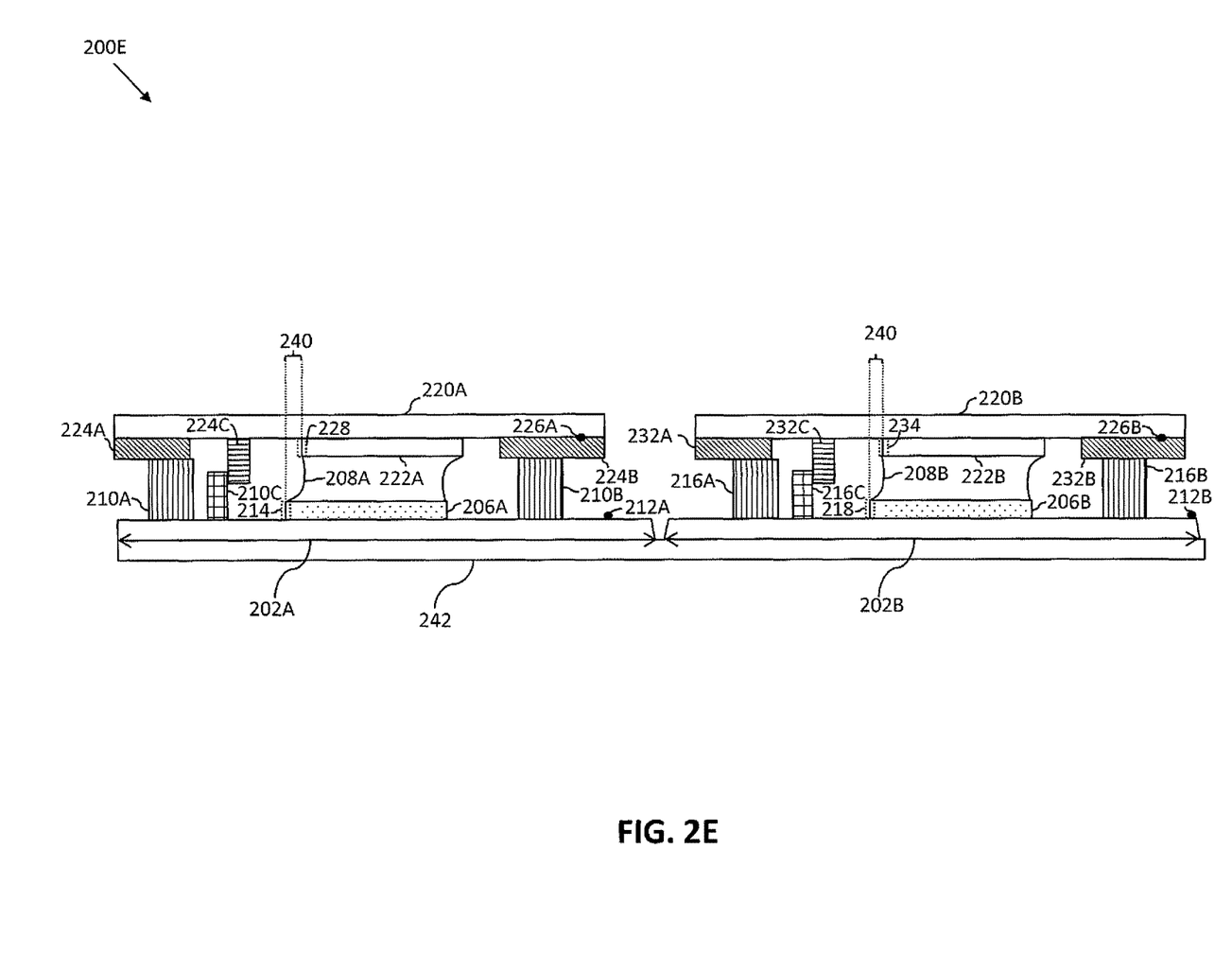

With reference to FIG. 2E, the cross-sectional view 200E illustrates a populated pre-singulated wafer 242 having the semiconductor dies 220 permanently attached to their corresponding sub-mounts. The first through third die mating features 224A-224C are in contact with the first through third sub-mount mating features 210A-210C, respectively. The first edge 214 of the first sub-mount pad 206A and the first edge 228 of the first die pad 222A have a second predetermined offset 240 therebetween. The second predetermined offset 240 is a target offset required for the accurate optical alignment of the first semiconductor die 220A. The reflow station reduces the temperature of the pre-singulated wafer 202 from the eutectic temperature 'T2' to the room temperature 'T0'. The reduction in the temperature results in the solidification of the first solder layer 208A, and hence the first semiconductor die 220A is permanently attached to the first sub-mount 204A at the final placement position.

It will be apparent to a person having ordinary skill in the art that the remaining semiconductor dies in the semiconductor dies 220, such as the second semiconductor die 220B, are attached to their corresponding sub-mounts of the pre-singulated wafer 202 at the corresponding final positions, simultaneously with the first semiconductor die 220A.

Figure 2F:
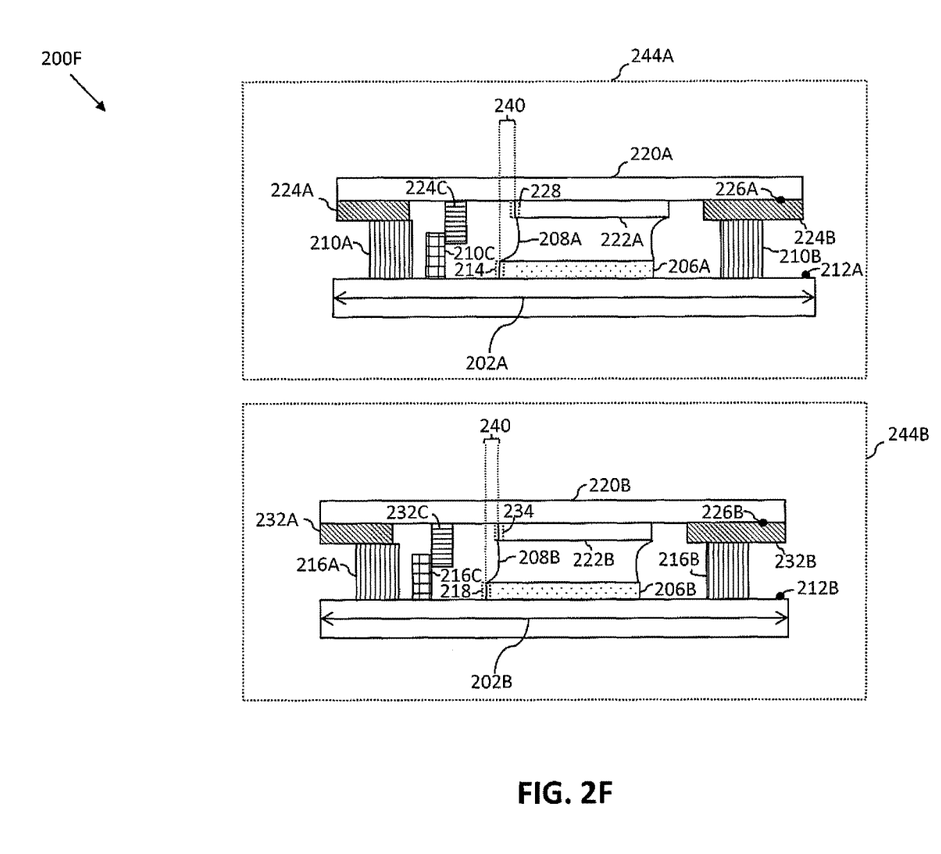

With reference to FIG. 2F, the cross-sectional view 200F illustrates first and second die attached sub-mount packages 244A and 244B obtained by dicing the populated pre-singulated wafer 242.

The populated pre-singulated wafer 242 is unloaded from the reflow station and loaded on a placement bench (not shown) of a dicing tool (not shown). The dicing tool dices the populated pre-singulated wafer 242 to obtain the first and second die attached sub-mount packages 244A and 244B. Hereinafter, the first and second die attached sub-mount packages 244A and 244B are collectively referred to as "die attached sub-mount packages 244". The first die attached sub-mount package 244A includes the first sub-mount 204A and the first semiconductor die 220A permanently attached to the first sub-mount 204A at the final placement position. The second die attached sub-mount package 244B includes the second sub-mount 204B and the second semiconductor die 220B permanently attached to the second sub-mount 204B at the final placement position.

It will be apparent to a person having ordinary skill in the art that multiple semiconductor dies may be attached to a single sub-mount by performing the abovementioned method without deviating from the scope and spirit of the present invention. In such a scenario, the array of sub-mount pads enables to cover a required mounting footprint of each semiconductor die.

In the wafer-level semiconductor die attachment method, in accordance with an embodiment of the present invention, during the placement of the first semiconductor die 220A at the initial placement position, the optical microscope can be set to a lower magnification level in comparison to the magnification level of the prior art solution, as the precision in alignment accuracy is achieved by way of the die mating features 224 and the sub-mount mating features 210 during the reflow process. The position of formation of each of the die mating features 224 and the sub-mount mating features 210 is based on the optical alignment requirement of the first semiconductor die 220A with the first sub-mount 204A. Hence, the contact between the die mating features 224 and the corresponding sub-mount mating features 210 results in 3-dimensional optical alignment accuracy. Therefore, the wafer-level semiconductor die attachment method achieves 3-dimensional optical alignment accuracy without the requirement of high initial placement accuracy, thereby requiring less time for placing the first semiconductor die 220A over the first sub-mount 204A in comparison to the placement time of the conventional semiconductor die attachment method that solely relies on die and sub-mount alignment features for achieving optical alignment accuracy.

Further, in the wafer-level semiconductor die attachment method, the steps of placing a semiconductor die over a sub-mount and heating the first portion of the solder layer that is in contact with the die pad of the semiconductor die are performed for a single semiconductor die at a time until each of the sub-mounts 204 has one or more semiconductor dies temporality held thereon. However, the reflow process for attaching the semiconductor dies 220 to the corresponding sub-mount of the sub-mounts 204 is performed at wafer-level in contrast to the conventional semiconductor die attachment method, where each sub-mount is reflowed separately. Based on the assumption that the die placement time is 1 second, the heating time for temporary holding the semiconductor dies 220 is 6 seconds, the reflow time is 60 seconds, and the dicing time is 1 second, the time required for obtaining 1,000 die attached sub-mount packages amounts to 8,059 seconds, i.e., 2.23 hours. Hence, the wafer-level semiconductor die attachment method saves almost 72 percent of time in comparison to the conventional semiconductor die attachment method, thereby reducing the cost of optoelectronic packaging and improving the process efficiency and the process throughput.

Figure 3A:
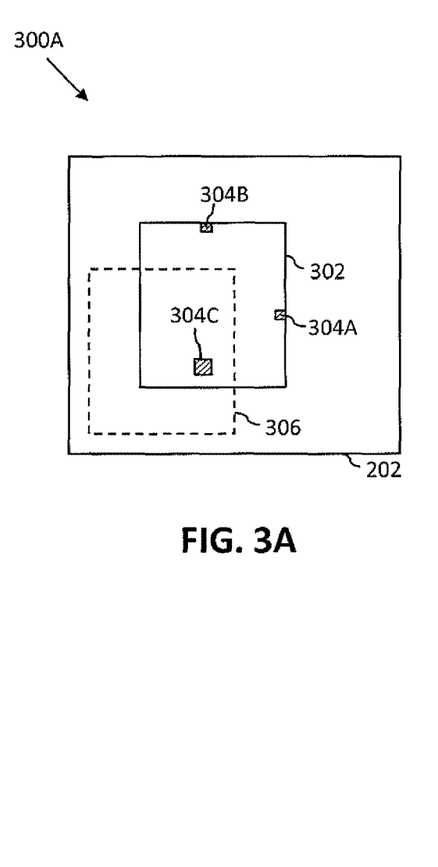
FIGS. 3A-3C are top views that illustrate an initial placement position and a final placement position of a semiconductor die on the pre-singulated wafer of FIGS. 2A-2F, in accordance with an embodiment of the present invention.
Figure 3B:
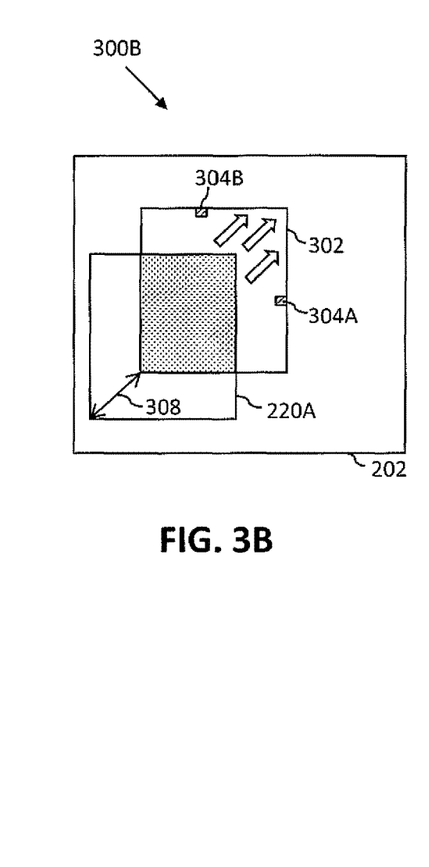
Figure 3C:
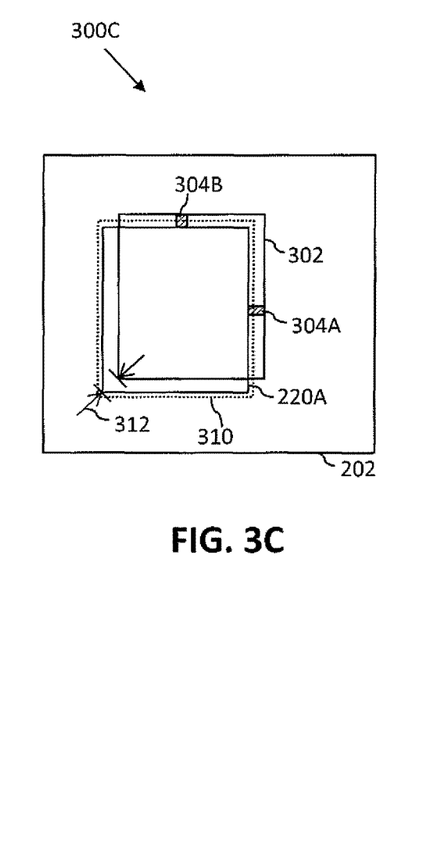

Referring now to FIGS. 3A-3C, top views 300A-300C that illustrate an initial placement position and a final placement position of the first semiconductor die 220A on the pre-singulated wafer 202 of FIGS. 2A-2F, in accordance with an embodiment of the present invention are shown.

With reference to FIG. 3A, the top view 300A illustrates a third sub-mount 302 of the pre-singulated wafer 202. In one example, the third sub-mount 302 is structurally and functionally similar to the first and second sub-mounts 204A and 204B. For the sake of simplicity, the top view 300A illustrates one sub-mount, i.e., the third sub-mount 302 of the pre-singulated wafer 202. However, it will be apparent to a person skilled in the art that the pre-singulated wafer 202 may have any number of sub-mounts.

The third sub-mount 302 has seventh through ninth sub-mount mating features 304A-304C. The seventh and eighth sub-mount mating features 304A and 304B are stop blocks that prevent a semiconductor die from sliding in lateral direction, along X-axis and Y-axis. The ninth sub-mount mating feature 304C is a stand-off structure that prevents the semiconductor die from sliding in vertically-downward direction, along Z-axis. The pre-singulated wafer 202 has an initial placement position 306 associated with the third sub-mount 302. In an embodiment, the initial placement position 306 associated with the third sub-mount 302 is such that when a semiconductor die, such as the first or second semiconductor die 220A or 220B, is placed at the initial placement position 306, the semiconductor die overlaps at least 70 percent of the third sub-mount 302.

With reference to FIG. 3B, the top view 300B illustrates the third sub-mount 302, when the first semiconductor die 220A is placed at the initial placement position 306. The dotted area represents the portion of the third sub-mount 302 that is overlapped by the first semiconductor die 220A, when the first semiconductor die 220A is placed at the initial placement position 306. A first corner of the first semiconductor die 220A and a first corner of the third sub-mount 302 have a first predetermined offset 308 between them, when the first semiconductor die 220A is placed at the initial placement position 306. Under the influence of the self-alignment restoring force during the reflow process, the first semiconductor die 220A slides along X-axis, Y-axis, and Z-axis, and is displaced from the initial placement position 306.

With reference to FIG. 3C, the top view 300C illustrates the third sub-mount 302, when the first semiconductor die 220A is placed at a final placement position 310. At the final placement position 310, the ninth sub-mount mating feature 304C comes in contact with a corresponding die mating feature, such as the first and second die mating features 224A and 224B, of the first semiconductor die 220A, and thus prevents the first semiconductor die 220A from sliding further along Z-axis. The seventh and eighth sub-mount mating features 304A and 304B come in contact with corresponding die mating features, such as the third die mating feature 224C, of the first semiconductor die 220A, and thus prevent the first semiconductor die 220A from sliding further along X-axis and Y-axis, respectively. When the reflow process ends, the self-alignment restoring force ceases to act on the first semiconductor die 220A, and hence the first semiconductor die 220A is permanently attached to the third sub-mount 302 at the final placement position 310. The first corner of the first semiconductor die 220A and the first corner of the third sub-mount 302 have a second predetermined offset 312 between them, when the first semiconductor die 220A is permanently attached to the third sub-mount 302 at the final placement position 310.

Figure 4:
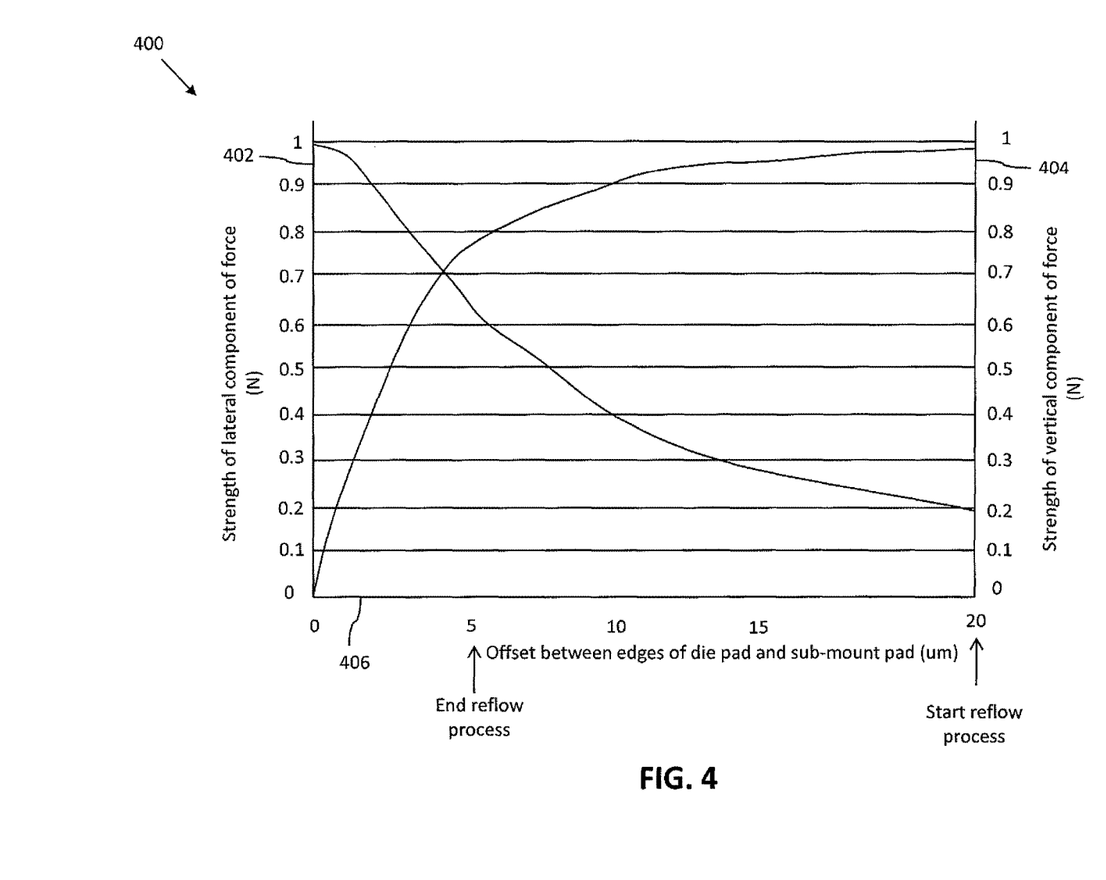
FIG. 4 is a graph that illustrates the effect of self-alignment restoring force on the plurality of semiconductor dies of FIGS. 2A-2F, in accordance with an embodiment of the present invention.

Referring now to FIG. 4, a graph 400 that illustrates the effect of the self-alignment restoring force on the semiconductor dies 220 of FIGS. 2A-2F in accordance with an embodiment of the present invention is shown. The graph 400 illustrates relative strength of lateral and vertical components of force as a function of displacement of each of the semiconductor dies 220.

Y-axis 402 indicates strength of the lateral component of force and Y-axis 404 indicates strength of the vertical component of force. X-axis 406 indicates value of offset between the first edge of the die pad of each of the semiconductor dies 220 and the first edge of the sub-mount pad of the corresponding sub-mount, respectively, under the influence of the lateral and vertical components of force. Each of the semiconductor dies 220 is placed at the corresponding initial placement position. Further, the first edge of each die-pad and the first edge of each corresponding sub-mount pad have the first predetermined offset 230, i.e., 20 µm, therebetween.

At the beginning of the reflow process, the lateral component of force causes each of the semiconductor dies 220 to slide laterally, and the vertical component of force pulls down each of the semiconductor dies 220 and causes it to slide vertically-downwards. A strength with which the lateral component of force displaces each of the semiconductor dies 220 laterally overcomes a strength with which the vertical component of force pulls each of the semiconductor dies 220 vertically-downwards, hence each of the semiconductor dies 220 continues to slide in lateral direction. Due to sliding of each of the semiconductor dies 220 in lateral direction, the offset between the first edges of each die-pad and the first edges of corresponding sub-mount pads decreases from the first predetermined offset 230, i.e., 20 µm. As a solder layer of each sub-mount attains a vertical orientation under the influence of the lateral component of the force, the strength of the lateral component of force reduces. However, the strength of the vertical component of force increases as the offset between the first edges of each die-pad and the corresponding sub-mount pad decreases from the first predetermined offset 230, i.e., 20 µm. In other words, the self-alignment restoring force shifts from a higher lateral orientation to a higher vertical orientation during the course of the reflow process. In an embodiment, the pre-singulated wafer 202 is reflowed for the predetermined time interval until the strength with which the lateral component of force displaces each of the semiconductor dies 220 laterally, overcomes the strength with which the vertical component of force pulls each of the semiconductor dies 220 vertically-downwards. Therefore, the reflow process is ended before the strength with which the lateral component of force displaces each of the semiconductor dies 220 laterally becomes less than the strength required for overcoming the effect of the vertical component of force.

Figure 5A:
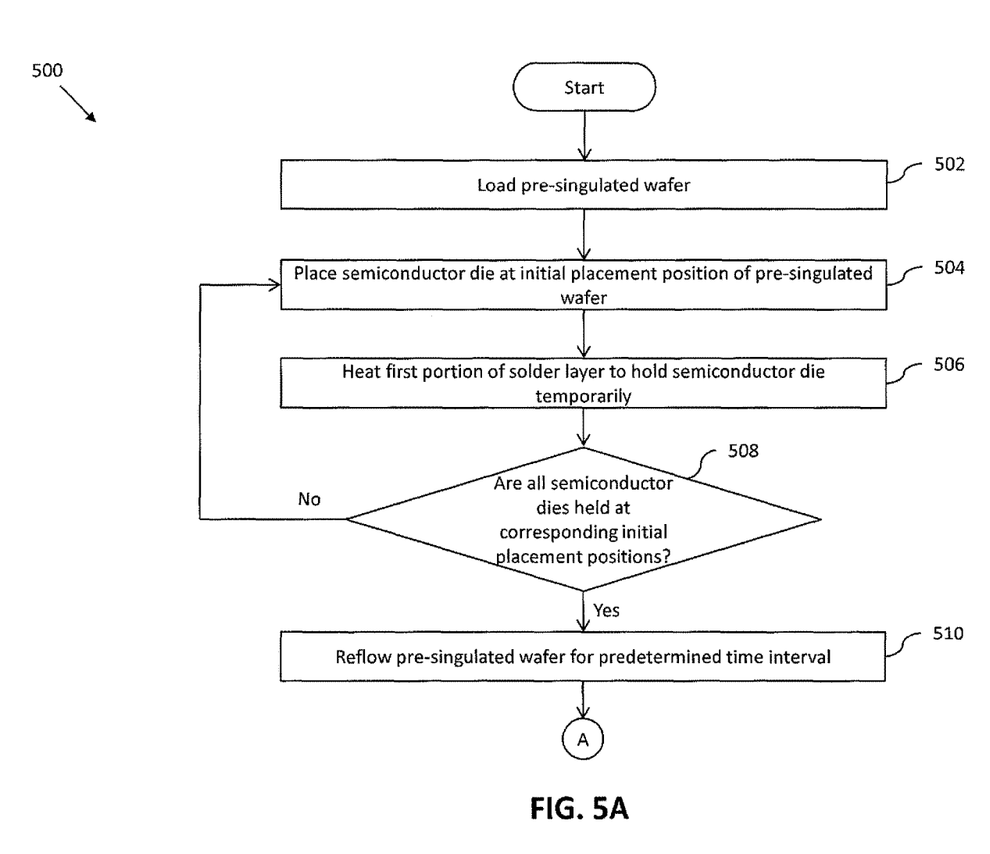
FIGS. 5A-5B collectively represent a flow chart that illustrates the wafer-level semiconductor die attachment method of FIGS. 2A-2F, in accordance with an embodiment of the present invention.
Figure 5B:
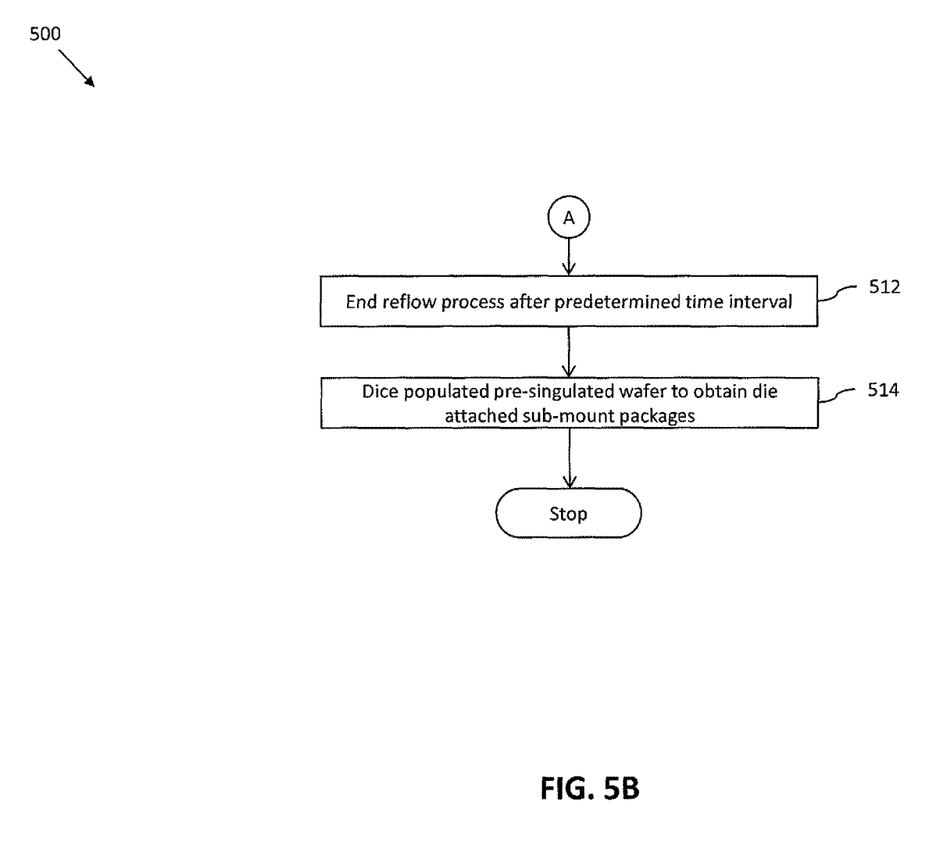

Referring now to FIGS. 5A-5B, a flow chart 500 that illustrates the wafer-level semiconductor die attachment method of FIGS. 2A-2F, in accordance with an embodiment of the present invention is shown.

At step 502, the pre-singulated wafer 202 is loaded on a placement bench (not shown) of a die placement tool (not shown). The pre-singulated wafer 202 has the sub-mounts 204. At step 504, a semiconductor die, such as the first or second semiconductor die 220A or 220B, of the semiconductor dies 220 is placed at an initial placement position associated with a sub-mount of the sub-mounts 204 on the pre-singulated wafer 202. When the semiconductor die is placed at the initial placement position, first edge of a sub-mount pad of the sub-mount and a first edge of a die pad of the semiconductor die have the first predetermined offset 230 between them, and the die pad is in contact with a first portion of the solder layer of the sub-mount.

At step 506, the first portion of the solder layer that is in contact with the die pad of the semiconductor die is heated by use of a laser beam (not shown) for temporarily holding the semiconductor die at the initial placement position. At step 508, it is determined whether all semiconductor dies 220 are temporarily held at the corresponding initial placement positions associated with the corresponding sub-mounts. If at step 508, it is determined that all semiconductor dies 220 are not temporarily held at the corresponding initial placement positions associated with the corresponding sub-mounts, step 504 is performed, and a next semiconductor die is placed on the corresponding sub-mount. If at step 508, it is determined that all semiconductor dies 220 are temporarily held at the corresponding initial placement positions associated with the corresponding sub-mounts, step 510 is performed.

At step 510, the pre-singulated wafer 202, having the semiconductor dies 220 temporarily held at the corresponding initial placement positions, is reflowed. During the reflow, the solder layer of each sub-mount of the sub-mounts 204 melts, and introduces the self-alignment restoring force. Under the influence of the self-alignment restoring force, each semiconductor die of the semiconductor dies 220 slides in lateral and vertically-downward direction from the corresponding initial placement position to a corresponding final placement position. Each semiconductor die continues to slide in the lateral and vertically-downward direction until the corresponding die mating features come in contact with the sub-mount mating features of the corresponding sub-mount. Thus, each semiconductor die stops sliding, when the corresponding die mating features come in contact with the sub-mount mating features of the corresponding sub-mount.

At step 512, the reflow process ends. When the reflow process ends, each of the semiconductor dies 220 is permanently attached to the corresponding sub-mount at the corresponding final placement position. At step 514, the populated pre-singulated wafer 242 is diced to obtain the die attached sub-mount packages 244. Each die attached sub-mount package includes at least one semiconductor die permanently attached to a sub-mount.

Thus, the wafer-level semiconductor die attachment method achieves high alignment accuracy without the requirement of high placement accuracy, thereby requiring less time for placing a semiconductor die over a corresponding sub-mount. Since the reflow process for attaching the semiconductor dies 220 to the corresponding sub-mount of the sub-mounts 204 is performed at wafer-level, the wafer-level semiconductor die attachment method saves almost 72 percent of time in comparison to the conventional die attachment processes, thereby reducing the cost of optoelectronic packaging and improving the process efficiency and the process throughput.

Techniques consistent with the present invention provide, among other features, methods for wafer-level semiconductor die attachment. While various exemplary embodiments of the disclosed system and method have been described above, it should be understood that they have been presented for purposes of example only, not limitations. It is not exhaustive and does not limit the invention to the precise form disclosed.

In the claims, the words 'comprising', 'including' and 'having' do not exclude the presence of other elements or steps then those listed in a claim. The terms "a" or "an," as used herein, are defined as one or more than one. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A wafer-level semiconductor die attachment method, comprising:
   placing a first semiconductor die of a plurality of semiconductor dies at an initial placement position to overlap a first portion of a sub-mount pad on a first sub-mount of a plurality of sub-mounts of a pre-singulated wafer, wherein a die pad of the first semiconductor die is in contact with a first portion of a solder layer deposited over the sub-mount pad, and wherein the first semiconductor die includes a first plurality of die mating features, and the first sub-mount includes a first plurality of sub-mount mating features;
   heating the first portion of the solder layer that is in contact with the die pad of the first semiconductor die to temporarily hold the first semiconductor die at the initial placement position; and
   reflowing the pre-singulated wafer,
   whereby the first semiconductor die slides from the initial placement position to a final placement position, and a contact is established between the first plurality of die mating features and the corresponding first plurality of sub-mount mating features, and whereby the first semiconductor die is permanently attached to the first sub-mount at the final placement position.

2. The wafer-level semiconductor die attachment method of claim 1, wherein the first semiconductor die and the first sub-mount further include a first die alignment feature and a first sub-mount alignment feature, respectively.

3. The wafer-level semiconductor die attachment method of claim 2, wherein the first semiconductor die is placed at the initial placement position by aligning the first die alignment feature with the first sub-mount alignment feature.

4. The wafer-level semiconductor die attachment method of claim 1, wherein a first edge of the sub-mount pad and a first edge of the die pad have a first predetermined offset therebetween, when the first semiconductor die is placed at the initial placement position.

5. The wafer-level semiconductor die attachment method of claim 1, wherein a first edge of the sub-mount pad and a first edge of the die pad have a second predetermined offset therebetween, when the first semiconductor die is permanently attached to the first sub-mount at the final placement position.

6. The wafer-level semiconductor die attachment method of claim 1, wherein the first semiconductor die slides in lateral and vertically-downward directions, when the pre-singulated wafer is reflowed.

7. The wafer-level semiconductor die attachment method of claim 1, further comprising dicing the pre-singulated wafer to obtain a plurality of die attached sub-mount packages, when each semiconductor die of the plurality of semiconductor dies is permanently attached to the corresponding sub-mount of the plurality of sub-mounts, wherein a first die attached sub-mount package of the plurality of die attached sub-mount packages includes the first semiconductor die that is permanently attached to the first sub-mount.

8. The wafer-level semiconductor die attachment method of claim 1, wherein the pre-singulated wafer is reflowed, when each semiconductor die of the plurality of semiconductor dies is temporarily held at the corresponding initial placement position.

9. The wafer-level semiconductor die attachment method of claim 1, wherein the semiconductor die overlaps a second portion of the sub-mount pad of the first sub-mount, when the first semiconductor die is permanently attached to the first sub-mount.

10. A wafer-level semiconductor die attachment method, comprising:
  placing a first semiconductor die of a plurality of semiconductor dies at an initial placement position to overlap a first portion of a sub-mount pad on a first sub-mount of a plurality of sub-mounts of a pre-singulated wafer, wherein a die pad of the first semiconductor die is in contact with a first portion of a solder layer deposited over the sub-mount pad, and wherein the first semiconductor die includes a first plurality of die mating features, and the first sub-mount includes a first plurality of sub-mount mating features;
  heating the first portion of the solder layer that is in contact with the die pad of the first semiconductor die to temporarily hold the first semiconductor die at the initial placement position;
  reflowing the pre-singulated wafer, when each semiconductor die of the plurality of semiconductor dies is temporarily held at the corresponding initial placement position,
    whereby the first semiconductor die slides from the initial placement position to a final placement position, and a contact is established between the first plurality of die mating features and the corresponding first plurality of sub-mount mating features, and whereby the first semiconductor die is permanently attached to the first sub-mount at the final placement position; and
  dicing the pre-singulated wafer to obtain a plurality of die attached sub-mount packages, when each semiconductor die of the plurality of semiconductor dies is permanently attached to the corresponding sub-mount of the plurality of sub-mounts.

11. The wafer-level semiconductor die attachment method of claim 10, wherein the first semiconductor die and the first sub-mount further include a first die alignment feature and a first sub-mount alignment feature, respectively.

12. The wafer-level semiconductor die attachment method of claim 11, wherein the first semiconductor die is placed at the initial placement position by aligning the first die alignment feature with the first sub-mount alignment feature.

13. The wafer-level semiconductor die attachment method of claim 10, wherein a first edge of the sub-mount pad and a first edge of the die pad have a first predetermined offset therebetween, when the first semiconductor die is placed at the initial placement position.

14. The wafer-level semiconductor die attachment method of claim 10, wherein a first edge of the sub-mount pad and a first edge of the die pad have a second predetermined offset therebetween, when the first semiconductor die is permanently attached to the first sub-mount.

15. The wafer-level semiconductor die attachment method of claim 10, wherein the first semiconductor die slides in lateral and vertically-downward directions, when the pre-singulated wafer is reflowed.

16. The wafer-level semiconductor die attachment method of claim 10, wherein a first die attached sub-mount package of the plurality of die attached sub-mount packages includes the first semiconductor die that is permanently attached to the first sub-mount.

17. The wafer-level semiconductor die attachment method of claim 10, wherein the semiconductor die overlaps a second portion of the sub-mount pad of the first sub-mount, when the first semiconductor die is permanently attached to the first sub-mount.

18. A die attached sub-mount package prepared by a process comprising the steps of:
  placing a first semiconductor die of a plurality of semiconductor dies at an initial placement position to overlap a first portion of a sub-mount pad on a first sub-mount of a plurality of sub-mounts of a pre-singulated wafer, wherein a die pad of the first semiconductor die is in contact with a first portion of a solder layer deposited over the sub-mount pad, and wherein the first semiconductor die includes a first plurality of die mating features, and the first sub-mount includes a first plurality of sub-mount mating features;
  heating the first portion of the solder layer that is in contact with the die pad of the first semiconductor die to temporarily hold the first semiconductor die at the initial placement position;
  reflowing the pre-singulated wafer, when each semiconductor die of the plurality of semiconductor dies is temporarily held at the corresponding initial placement position,
    whereby the first semiconductor die slides from the initial placement position to a final placement position, and a contact is established between the first plurality of die mating features and the corresponding first plurality of sub-mount mating features, and whereby the first semiconductor die is permanently attached to the first sub-mount at the final placement position; and
  dicing the pre-singulated wafer to obtain a plurality of die attached sub-mount packages, when each semiconductor die of the plurality of semiconductor dies is permanently attached to the corresponding sub-mount of the plurality of sub-mounts, wherein a first die attached sub-mount package of the plurality of die attached sub-mount packages includes the first semiconductor die that is permanently attached to the first sub-mount.

19. The die attached sub-mount package prepared by the process of claim 18, wherein a first edge of the sub-mount pad and a first edge of the die pad have a first predetermined offset therebetween, when the first semiconductor die is placed at the initial placement position.

20. The die attached sub-mount package prepared by the process of claim 18, wherein a first edge of the sub-mount pad and a first edge of the die pad have a second predetermined offset therebetween, when the first semiconductor die is permanently attached to the first sub-mount.

* * * * *